United States Patent [19]
Hayashi et al.

[11] Patent Number: 5,599,590
[45] Date of Patent: Feb. 4, 1997

[54] TEXTURE TREATMENT FOR CARBON SUBSTRATE AND FOR CARBON OVERCOAT LAYER OF MAGNETIC DISKS

[75] Inventors: Hidetaka Hayashi, Saratoga; Masago Kuwabara, Fremont, both of Calif.; Kazuo Muramatsu, Hyogo, Japan; Dilip Kuchibhatla, San Jose, Calif.

[73] Assignee: Kobe Steel USA Inc., Palo Alto, Calif.

[21] Appl. No.: 254,788

[22] Filed: Jun. 6, 1994

Related U.S. Application Data

[63] Continuation-in-part of Ser. No. 139,592, Oct. 20, 1993, abandoned, which is a continuation-in-part of Ser. No. 92,833, Jul. 16, 1993, abandoned.

[51] Int. Cl.$^6$ .................................................... B05D 3/06
[52] U.S. Cl. ................. 427/448; 204/192.1; 204/192.11; 427/129; 427/130; 427/131; 427/132; 427/250; 427/275; 427/301; 427/309; 427/314; 427/383.3; 427/455; 427/576; 427/585; 427/597; 428/695; 428/900; 428/928; 428/694 SG
[58] Field of Search .................................. 427/127–132, 427/585, 275, 576, 250, 443.2, 301, 448, 309, 445, 314, 597, 383.3, 555; 428/694, 695, 900, 928, 64; 204/192.1, 192.11

[56] References Cited

U.S. PATENT DOCUMENTS 4,716,078  12/1987  Kishine et al. .......................... 428/336
4,833,001   5/1989  Kijima et al. ............................ 428/141

FOREIGN PATENT DOCUMENTS 2242423    10/1991  United Kingdom .
WO88/05953  8/1988  WIPO .

*Primary Examiner*—Bernard Pianalto
*Attorney, Agent, or Firm*—Oblon, Spivak, McClelland, Maier, & Neustadt, P.C.

[57] ABSTRACT

A texture treatment for a carbon substrate of a magnetic disk or for a carbon overcoat layer of a magnetic disk is effective to prevent the generation of a stiction phenomenon between a magnetic head and the surface of a magnetic disk. The texture treatment for a carbon substrate or carbon overcoat of a magnetic disk involves the steps of: preparing the carbon disk surface; forming a catalytic material layer on the surface; and performing a heat treatment of the disks in an oxidizing atmosphere. Preferably, islands of catalytic material are formed on the surface by sputtering, and a laser heat treatment is used in an oxidizing atmosphere.

20 Claims, 9 Drawing Sheets

(1 of 9 Drawing(s) in Color)

Cr island area        Masked Area
                      No Cr islands
                          X200

TEXTURE TREATMENT FOR CARBON SUBSTRATE AND FOR CARBON OVERCOAT LAYER OF MAGNETIC DISKS

RELATIONSHIP TO COPENDING APPLICATION

This application is a continuation-in-part of application Ser. No. 08/139,592 filed Oct. 20, 1993, which is a continuation-in-part of application Ser. No. 08/092,833 filed Jul. 16, 1993 both now abandoned. These applications are incorporated herein by reference in their entirety.

BACKGROUND OF THE INVENTION

1. Field of the Invention

The present invention relates to a texture treatment process for the carbon substrate of a magnetic disk and for the carbon overcoat layer of a magnetic disk for preventing the generation of a stiction phenomenon between a magnetic head sliding surface and the magnetic disk surface.

2. Description of the Background

Prior art magnetic disks are generally constituted of an Al substrate coated with a Ni-P plating material or the like and a magnetic film formed thereon. In a magnetic disk reproducing unit, a magnetic head is disposed on a magnetic disk. The magnetic head, which flies by rotation of the magnetic disk, performs the writing and the reproduction; however, there often occurs a stiction phenomenon between the magnetic head sliding surface and the magnetic disk surface when the magnetic disk is at rest. The stiction phenomenon is due to the fact that, when the magnetic head sliding surface and the magnetic disk surface, being made extremely smooth, face each other and are spaced apart by a nano-gap, and the gap is filled with liquid lubricant molecules of $O_2$, $N_2$, $H_2O$ and the like. This generates a large attractive force from the interfacial tension. The stiction phenomenon presents such a resistance to disk motion that the start-up of a motor for driving the magnetic disk consumes a large amount of power.

To prevent the stiction phenomenon, the mirror-finished surface of the substrate is textured to adjust the surface roughness prior to the coating of a magnetic film on the Al substrate of the magnetic disk. One of the texture treatments involves applying a moving polishing tape in the radial direction of a rotating Al substrate (coated with Ni-P plating material). Such a polishing tape comprises a tape on which abrasive made of silicon carbide, alumina or diamond are adhered. This mechanical texture treatment forms concentric scratches on the surface of the Al substrate of the magnetic disk. This process produces a rough surface in which the scratches are disposed in the circumferential direction.

The prior art texture treatment for an Al substrate of the magnetic disk is disadvantageous in that it is extremely difficult to suitably adjust the surface roughness. In order to increase the recording density, it is preferred that the flying height (spacing) of the magnetic head over the magnetic disk is minimized. However, as described above, the surface roughness of the Al substrate of a magnetic disk is a limiting factor. If the roughness is too large, the spacing between the magnetic head and the magnetic disk is too large, frustrating efforts to increase the recording density of the magnetic disk.

A carbon substrate has been proposed as a different type substrate for a magnetic disk in Kobe Technical Report, Vol. 39, No. 4, pp. 35 to 38, 1989. See also U.S. Pat. No. 4,716,078. The carbon substrate is lightweight, has high strength, and is excellent in heat resistance and surface accuracy. As compared with an Al substrate, the carbon substrate has the ability to improve the recording density of a magnetic disk.

The present inventors have earnestly studied the texture treatment of amorphous carbon substrates. As a result, it was found that, by the steps of polishing an amorphous carbon substrate to a specified surface roughness, and then heating it at a specified temperature in an oxidizing atmosphere, it is, possible to treat an amorphous carbon substrate to obtain a surface roughness suitable for a magnetic disk. Thus, the invention accomplished under this principle has been filed as Laid-open Japanese Patent Application Nos. 410434/1990 and No. 410436/1990. See also GB 2,242,423A.

In this process, the amorphous carbon substrate is polished to a specified surface roughness, and is heated at a temperature of from 300° C. to 1000° C., preferably, from 400° C. to 700° C. The oxidation reaction $C+O_2 \rightarrow CO_2$ occurs. The gasified carbon (represented by the carbon dioxide gas) leaves surface irregularities on the polished surface. Accordingly, by control of the heating conditions such as the temperature and the treatment time, it is possible to easily treat the amorphous carbon substrate to a specified surface roughness, and hence to prevent the surface from being made more rough than necessary. This prevents the head stiction to the magnetic disk, improves the characteristics of the magnetic film formed on the amorphous carbon substrate.

The technique disclosed in the early applications and described above has achieved an effect not obtained by the prior art texture treatment processes. However, it has disadvantages. The above-described technique uses the chemical reaction between carbon and oxygen. In the chemical texturing process, the surface irregularities are determined by of crystal grains, aggregates of crystal grains and the polishing scratches. As the roughness of the texture is increased, the oxidation reaction at the polishing scratches is enhanced, often generating deeper scratches. The generation of the deeper scratches along the radial direction of the substrate tends to cause media errors such as bit shifts.

SUMMARY AND OBJECTS OF THE INVENTION

Accordingly, an object of the present invention is to provide an improved method for performing a texture treatment of a carbon surface to yield a textured or roughened surface and products made comprising a layer having this surface.

In summary, the method of this invention is a texture treatment of an amorphous or glassy carbon surface of a magnetic recording medium comprising the steps of forming discrete areas of a solid oxidation catalyst on the carbon surface and heating the surface in the presence of oxygen to effect preferential oxidation of carbon at the surface adjacent to the catalyst. The oxidation catalyst is preferably formed as discrete islands by sputtering, ion implantation, chemical vapor deposition, plasma spraying, solution immersion or solution co-precipitation. The preferred oxidation catalysts are non-magnetic catalytic transition metals such as chromium, tantalum and copper, for example. The carbon surface can be a base substrate or an overcoating layer, for example.

For complete surface texturing, the discrete areas of the solid oxidation catalyst are formed over the entire carbon substrate surface. For zone texturing, the discrete areas of the solid oxidation catalyst are formed on one or more limited zones of the carbon surface, the remainder of the carbon surface remaining free of solid oxidation catalyst. Alternatively, for zone texturing the solid oxidation catalyst is deposited over the entire surface area; then localized heating is applied to selected areas of the surface with a focused laser beam or with a high power lamp using a mask to limit exposure to areas to be oxidized, the carbon surface unexposed to the localized heating remaining free of oxidation.

In summary, the carbon surface of the products of this invention can be a polished carbon substrate or a carbon overcoat layer applied over a magnetic recording material on a magnetic disk. Preferably, the textured carbon surface has a homogeneous, uniformly distributed roughness or a circumferential annular pattern of roughened areas which has a roughness Ra which is greater than the roughness of the initial carbon surface. The surface irregularities and depressions can have oxidation catalyst residues therein. Optimally, the textured areas of the surface have a homogeneous, uniformly distributed, roughness controlled to be within the range of from 10 Å to 200 Å Ra and an Rmax of less than 10×Ra.

When the carbon surface is the primary support surface (substrate) for the magnetic medium, the surface can support a non-magnetic undercoating layer which can be, for example, a layer of chromium. This layer can support a conventional magnetic recording layer which can, in turn, be covered by an overcoat layer.

When the carbon surface is a carbon overcoat, it can in turn, support a lubricant material.

The carbon surface can have texturing over the entire surface or on one or more limited zones thereof.

BRIEF DESCRIPTION OF THE FIGURES

The file of this patent contains at least one drawing executed in color. Copies of this patent with color drawing(s) will be provided by the Patent and Trademark Office upon request and payment of the necessary fee.

DETAILED DESCRIPTION OF THE PREFERRED EMBODIMENTS

In the carbon surface texture treatments prior to this invention, the oxidation process is increased in the portions where polish scratches are present as compared with those areas free from scratches, thus causing selective oxidation and a non-homogeneous and less controlled roughness. On the other hand, when a metal which functions as an oxidation catalyst is present on the surface of the carbon, the oxidation of the carbon is promoted by the catalytic metal. The oxidation rate in the region of the metal catalyst is much higher than in the regions where the polish scratches are present. Therefore, in the present invention, by depositing a catalytic metal on the surface of the carbon substrate and then oxidizing the surface, it is possible to avoid deepening the polish scratches. The same treatment can be applied to a carbon overcoat layer to produce the same texture pattern.

Most metals, especially including transition metals, and some other elements and compounds which catalyze the oxidation of carbon by oxygen may be used as the above catalyst since they exhibit the catalytic effect on the oxidation of carbon required by the process of this invention. However, non-magnetic elements such as Cr, Ta and Cu are preferable for use in magnetic disk media. In particular, Cr is preferable because it is desirable as the underlayer of the magnetic film layer.

The catalytic materials can be deposited on the polished carbon surface by common film forming techniques such as sputtering, ion implantation, chemical vapor deposition (CVD), plasma spraying, or evaporation. Moreover, chemical methods such as solution immersion or solution co-precipitation to produce the catalytic areas is effective to reduce cost. Undercoating, magnetic and overcoat layers are similarly applied by processes which are conventional and well-known in the art. These methods are described by Mee, C. et al, MAGNETIC RECORDING HANDBOOK; TECHNOLOGY AND APPLICATIONS, New York:McGraw-Hill (1990), and the entire contents of this book and the publications cited therein are incorporated herein by reference.

In the texturing process of this invention, a catalytic material such as Cr is deposited on a carbon substrate or on a carbon overcoat layer to form islands or discrete discontinuous areas on the entire area or on one or more selected areas of the carbon surface. The catalyst-containing surface is then heated to oxidized carbon at the surface to $CO_2$ and roughen the carbon surface. The carbon surface may be heated, for example in a vacuum furnace or oven, or with a high power intensity lamp, to temperatures within the range of from 300° C. to 1000° C., preferably, from 300° C. to 700° C. in an oxidizing atmosphere.

In a preferred embodiment, the catalyst-containing carbon surface is irradiated with laser light or a high power lamp to rapidly heat the carbon surface for roughening. Using laser light or a high power lamp, the temperature of the carbon substrate can be rapidly heated to texture and roughen the surface and then the substrate can be brought to room temperature quickly, thereby facilitating manufacturing throughput of the magnetic recording media. Any laser or lamp capable of raising the temperature of the carbon substrate to several hundred degrees (300°–1,000° C.) in a time span of about 5–300 seconds, preferably 5–180 seconds, may be used in this embodiment of the invention. Suitable lasers include Nd:YAG and $CO_2$ lasers which are commercially available. It is particularly preferred to use a $CO_2$ laser which is less expensive than a Nd:YAG laser.

It is preferable to use a $CO_2$ laser having a laser power which can be varied in the range from about 10–5,000 watts, preferably about 10–2,000 watts. Suitable $CO_2$ lasers have a wavelength of 10.4 microns. The laser light beam may have any desired cross section. Further, from spectrophotometric measurements, it has been found that the carbon substrate absorbs about 50% of the laser beam energy at the 10.4 micron wavelength. This degree of absorption is suitable for control of the oxidation process. The cross section of the laser beam is determined by the use of specific optics with the laser and can be adjusted to have a square, rectangular, circular shape and the like. The cross section of the laser beam may be varied from about 1–15 mm, preferably about 1–10 mm. The laser is preferably operated with a continuous wave output.

The catalyst-containing carbon surface is irradiated with the laser by moving the laser relative to the catalyst-containing carbon surface or, conversely, by moving the catalyst-containing carbon surface relative to the laser. It is convenient to rotate a magnetic media disk while irradiating the disk with the laser light. In this embodiment, circumferential annular textured areas may be produced by irradiating the inner or outer radial areas of the disk. This process also allows one to roughen the entire disk surface by scanning the laser across the entire diameter of the disk or using an unfocus laser, or to produce concentric annular roughened areas by selectively irradiating two or more annular areas.

When using laser irradiation, the surface is generally roughened to a texture of about 10–200 Å (Ra), preferably, about 10–100 Å. The specific degree of texturing is dependent upon the laser beam size, the disk rotational speed, the time the laser beam is incident on the disk, the laser beam shape and the laser beam intensity profile. One having ordinary skill in this art can readily adjust these parameters to obtain the desired degree of roughened texture.

The oxidizing atmosphere can contain, as oxygen sources, air, $O_2$, atomic oxygen, water vapor or ozone, for example. The oxidation reaction $C+O_2 \rightarrow CO_2$ occurs, and the carbon is selectively gasified. This forms fine irregularities on the surface. Accordingly, by control of the heating conditions such as the treatment temperature and the treatment time, the kind of catalytic material to be deposited, and the configuration of the deposits, it is possible to achieve a controlled, uniform distribution of pits or irregularities where carbon has been removed. Because the most rapid oxidation occurs in the areas occupied by the catalyst, the desired oxidation is essentially selective to the catalyst areas. This method avoids deepening scratches left by the polishing process and provides a product which is free from bit errors caused by such scratches.

The controlled and uniform roughness prevents the head stiction to the magnetic disk, improves the characteristics of magnetic film formed on the carbon substrate, and hence allows a reduction of the spacing between the magnetic head and the magnetic disk surface not obtainable by previously known roughening processes.

The undercoat layer is made from conventional non-magnetic materials used for this purpose. This layer can be made of non-magnetic materials such as chromium, tungsten, tantalum, copper, chrome-vanadium, chrome-tungsten, and the like. Preferred undercoating metals are chromium, tantalum and copper, and optimally, the undercoating material is the same as the catalyst.

The magnetic layer is made of conventional magnetic materials used for this purpose. Suitable materials can include compounds represented by the following formulas: CoNiPt, CoCrX, CoCrXB, CoCrXY, CoCrXYB, where X and Y are independently selected from the group consisting of Ni, Ta and Pt.

The overcoat layer is made of conventional non-magnetic materials used for this purpose. Suitable materials include carbon, ZrO and BN, for example.

In magnetic media of this invention, zone texturing may also be used to improve the magnetic properties of the product. In these developments, a roughened surface zone is provided to support the head when the disk is stationary, and the remainder of the disk surface is polished and smooth to improve recording properties. In the process of this embodiment, the carbon surface area to be textured is exposed to catalyst deposition, and the remainder of the carbon surface is shielded to prevent catalyst deposition. Subsequent controlled oxidation of the surface can be applied to texture the catalyst bearing areas, leaving the shielded areas in their original, polished condition. Alternatively, using a focused laser beam without masking or a high power lamp with masks, only selected, localized areas of the surface exposed to catalyst deposition can be textured.

This invention is further illustrated by the following specific but non-limiting examples, considered in conjunction with the figures noted therein.

EXAMPLES

Example 1

Surface Texturing by Catalytic Oxidation

The surface of a carbon substrate (outside diameter—65mm; inside diameter—20 mm; thickness—0.635 mm) was mirror-polished to form a polished surface with a surface roughness of 10 Å Ra. The surface of the substrate was scrubbed using an alkali detergent, followed by rinsing using pure water, the final rinse being hot water. The disk was then allowed to dry.

The substrate was set on a substrate holder in a DC magnetron sputtering system. Using a Cr target with a purity of 99.9%, Cr was formed on the substrate to a calculated thickness of 5 Å so as to be dotted like islands. The test condition was as follows: The Ar gas pressure was 5 m torr; the DC power was 90 W; and the substrate temperature was 100° C.

The substrate was heated at 600° C. for 15 minutes for oxidation of the surface of the substrate, to thus prepare the carbon substrate with a texture for a magnetic disk.

The substrate thus obtained was measured for the surface roughness using atomic force microscopy (AFM). As a result, the surface roughness was determined to be 100 Å Ra and 800 Å Rmax.

Figure 1:
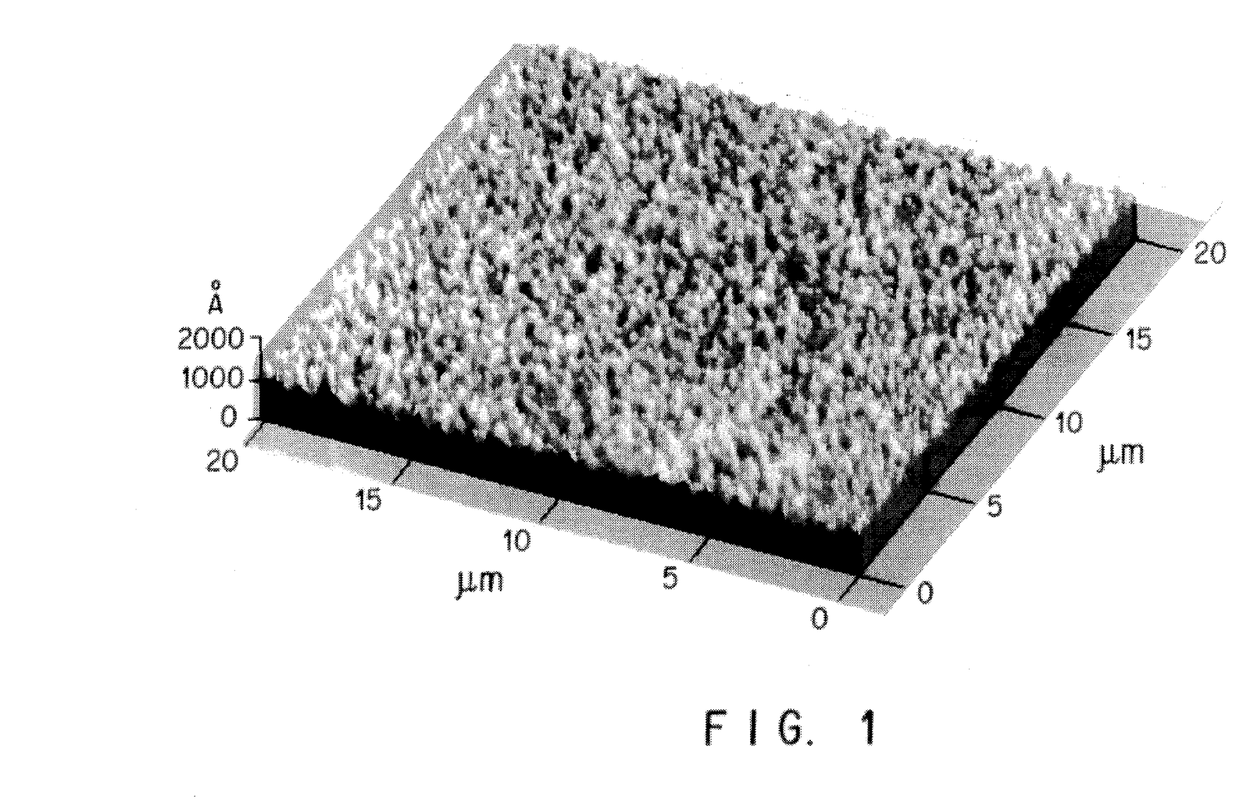
FIG. 1 is an atomic force microscope image showing the surface roughness of a carbon substrate subjected to a texture treatment according to the present invention.

Table 1 shows the results of visual observation under a white light for the scratches of the substrate obtained, as compared with comparative example in which the surface of the substrate was oxidized to a surface roughness of 100 Å Ra without the deposition of Cr. Also, an AFM image of the surface of the substrate surface is shown in FIG. 1

TABLE 1

|  | Number of scratches per one surface | Surface roughness Ra (Å) |
| --- | --- | --- |
| Working Example 1 | 0 | 100 |
| Comparative Example | 37 | 100 |

Example 2

Applying Media Film to Catalytically Textured Carbon Surface

Magnetic disk media were prepared by DC magnetron sputtering with Cr, CoCrPt and carbon targets. The Ar pressure was 5 mTorr. A media film was deposited on a polished carbon substrate and on a textured carbon substrate made by the method of this invention.

Figure 2:
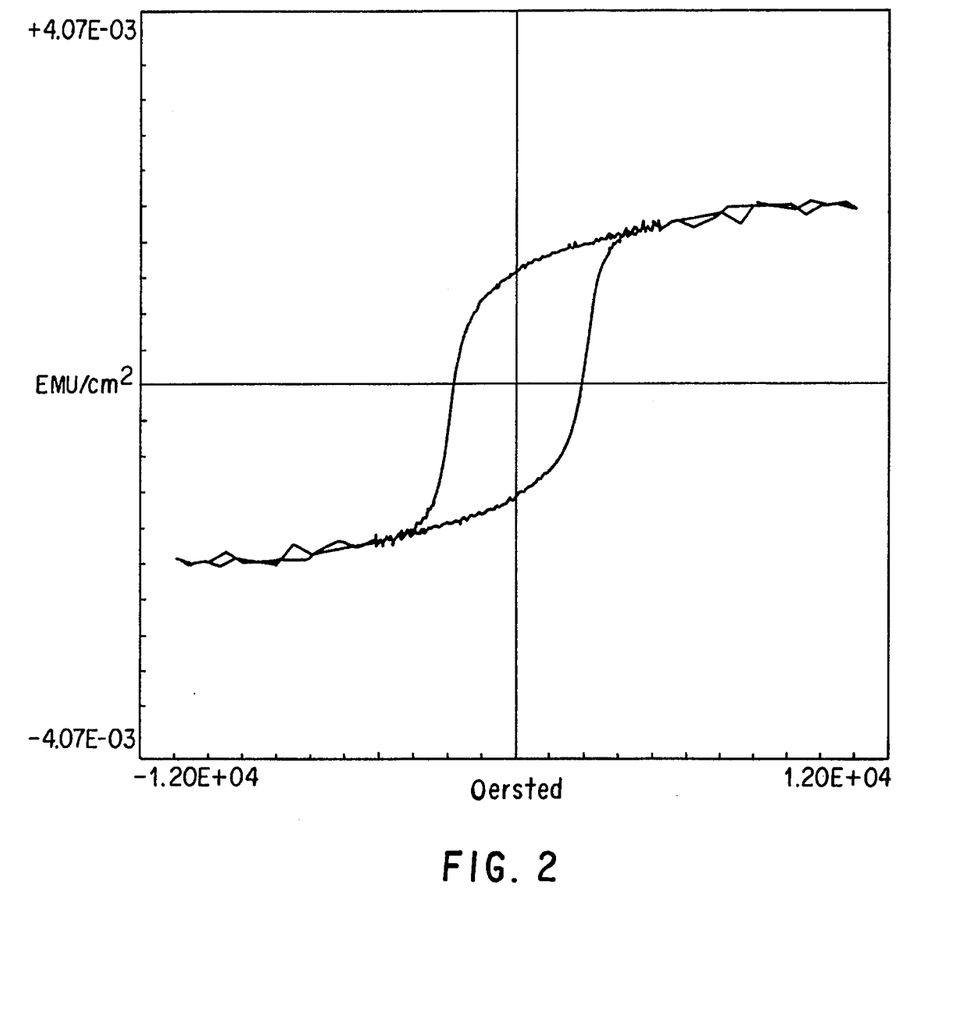
FIG. 2 is the hysteresis loop of the CoCrPt media deposited on the textured substrate.

FIG. 2 shows the hysteresis loop measured for the media film deposited on the textured substrate. The coercivity of this layer was about 2250 Oe, about 10% lower than that of the layer deposited on a polished substrate (the same layer deposited on a polished carbon substrate measured Hc=about 2500 Oe). The magnetic moment was also about 15% lower.

Figure 3:
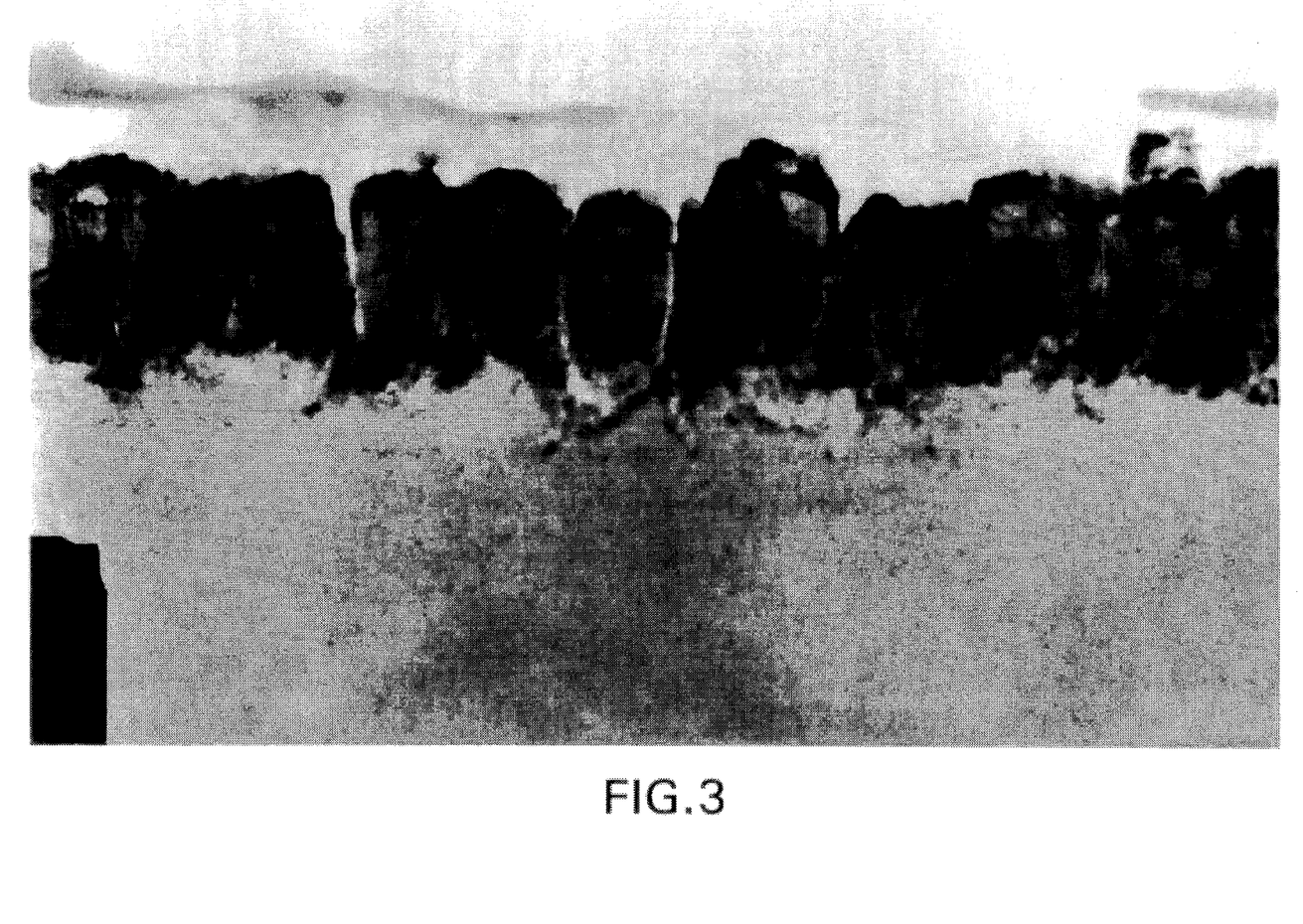
FIG. 3 is the cross-sectional ITEM image of the media deposited on the textured substrate.
Figure 4:
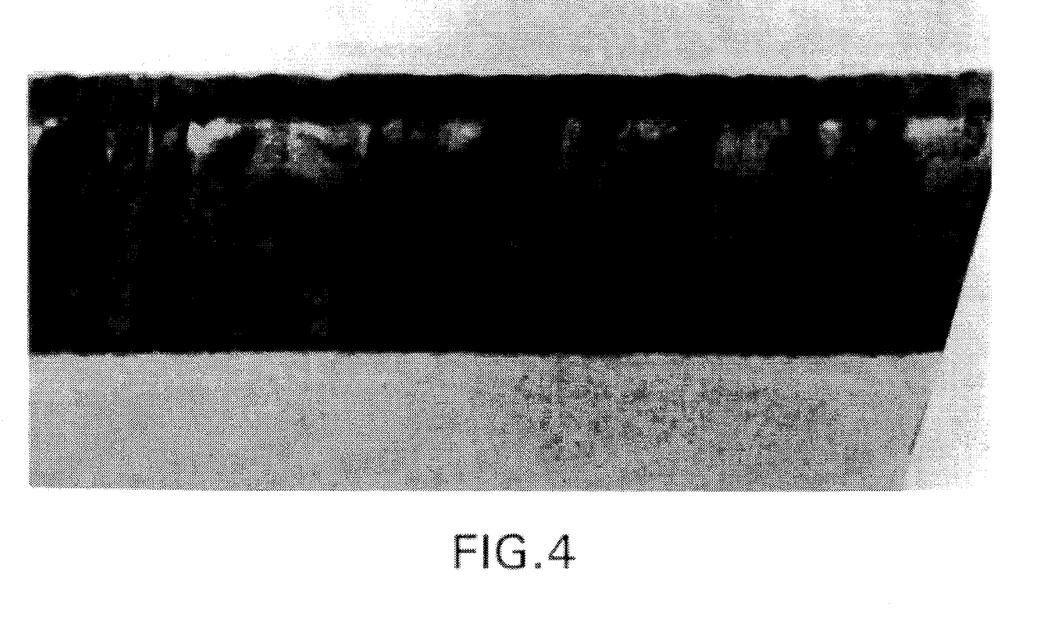
FIG. 4 is the cross-sectional TEM image of the media deposited on the polished substrate.

FIG. 3 is a cross-sectional transmission electron microscope (TEM) image of the media film deposited on the textured substrate, and FIG. 4 is the cross-sectional TEM image of the media film deposited on the polished substrate. It is apparent from these micrographs that the interface between the carbon substrate and Cr underlayer are quite different for textured and untextured surfaces, and that the interface of the Cr underlayer deposited on the textured substrate yields a much rougher surface, (Ra=about 120 Å). The surface roughness can be controlled by changing the amount of chromium deposited or the heating temperature and/or time of the oxidation process. Therefore, once the optimum process conditions for suitable surface roughness are found, the magnetic properties of the film can be improved to the level of those of the film deposited on a polished substrate or even better.

Figure 5:
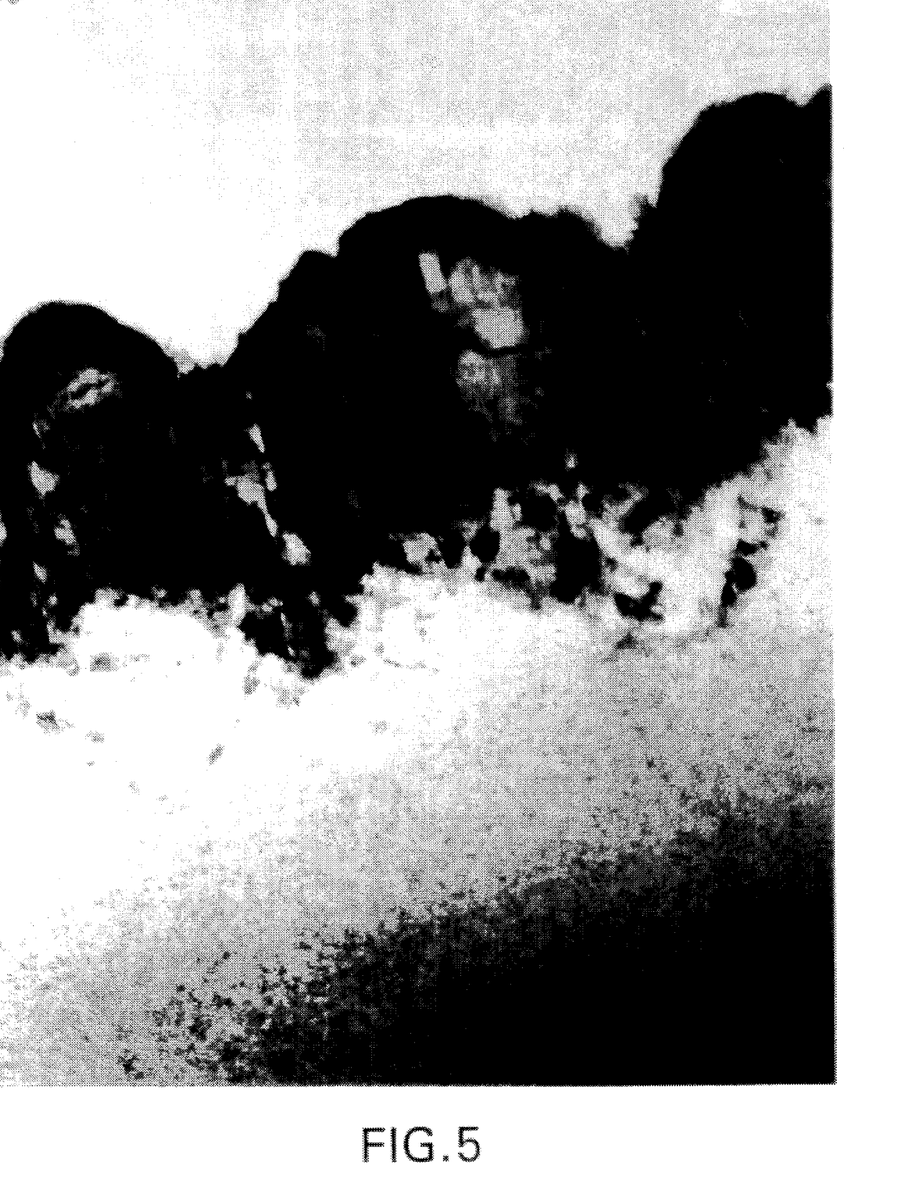
FIG. 5 is an enlarged TEM showing deposits on a sine-curve area of the textured substrate.

FIG. 5 is an enlarged TEM showing deposits on a sine-curve area of the textured substrate. The directions of the columns of Cr change according to the surface normal of the substrate. However, the magnetic layer is still continuous. This kind of textured surface is suitable for stiction/friction properties.

Example 3

Zone Texturing

Figure 6:
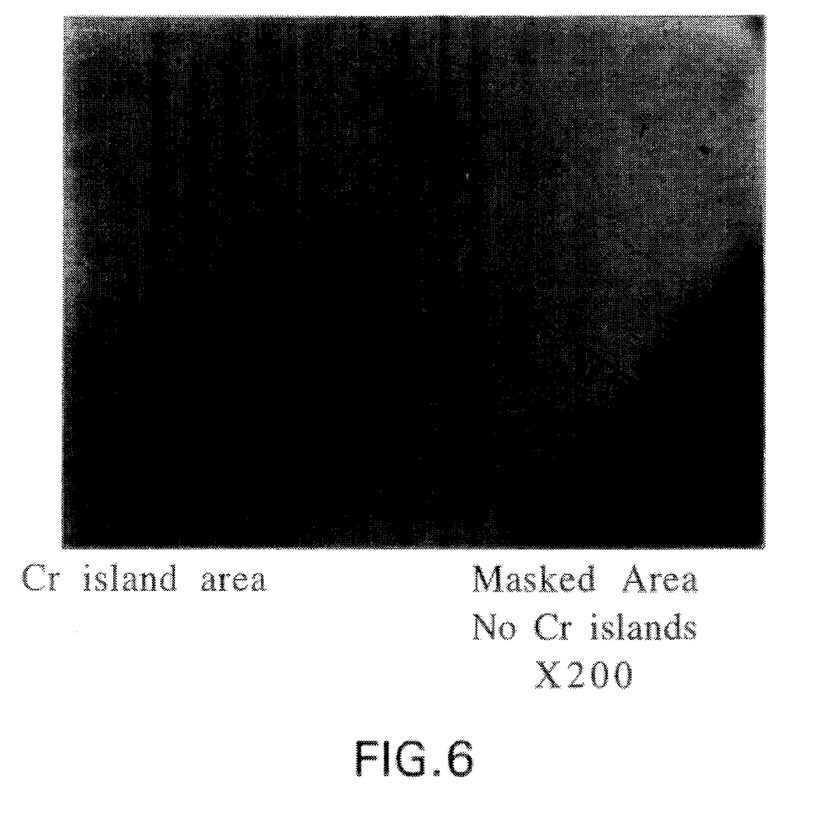
FIG. 6 is a microscope image of an oxidized carbon surface, a portion of which had a catalytic deposit and a portion of which had no catalytic deposit.

As a demonstration of possible zone texturing, a cover glass was used to prevent Cr island formation on a selected area of a carbon substrate. After Cr deposition, the masked area could not be usually recognized. However, once the substrate was oxidized in a furnace, the area that had Cr islands became less shiny, but the masked area (no Cr islands) showed little or no change. Therefore, the oxidation occurred heavily only on the area that had Cr islands, due to Cr catalytic effects. FIG. 6 is an optical micrograph of the substrate which was oxidized. The right half is the masked area (no Cr islands). Enhanced polish marks can be observed in the masked area, but visible polish marks are not present in the area textured with Cr islands. Therefore, it is confirmed that simple masking during the deposition of small amounts of Cr can produce zone (patterned) texturing on the carbon substrates. By controlling the heating temperature and heating time the masked area can be maintained in a polished condition while the Cr deposited area can be textured.

Example 4

Laser Texturing with a $\frac{3}{8}$ in.$^2$ $CO_2$ Laser Beam

In this experiment, a $CO_2$ continuous wave laser having a variable power of 10–2000 watts was operated at 1000 watts and used to deliver a square beam having a $\frac{3}{8}$ inch width. This laser was used to irradiate a polished carbon substrate onto which was sputtered a 5 Å layer of Cr metal as discrete islands. The disk shaped substrate was rotated at speeds varying from 10–100 rpm and irradiated for 10 seconds to produce circumferential texturing.

Example 5

Texturing with $CO_2$ Laser (1 mm Beam Size)

Figure 7:
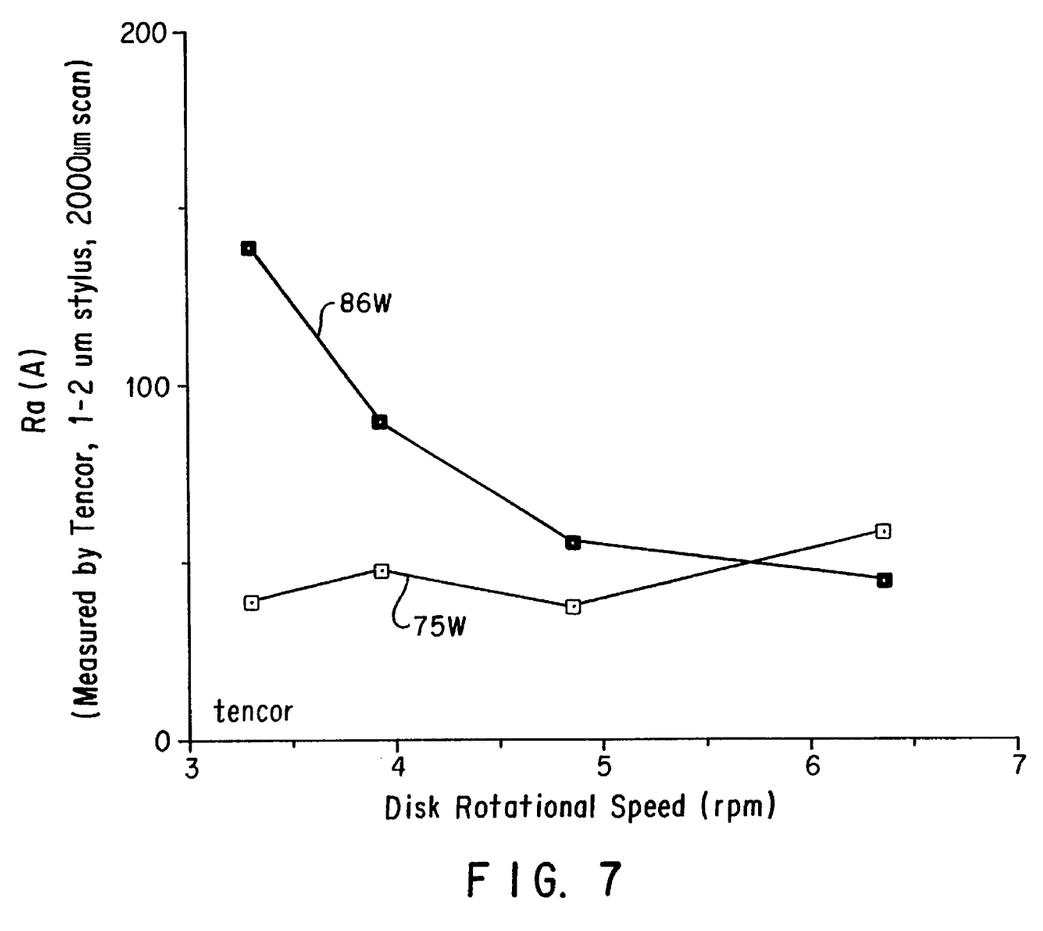
FIG. 7 is a graph showing the relative texturing of a carbon substrate with a $CO_2$ laser at 75 W and 86 W using different disk rotational speeds.
Figure 8:
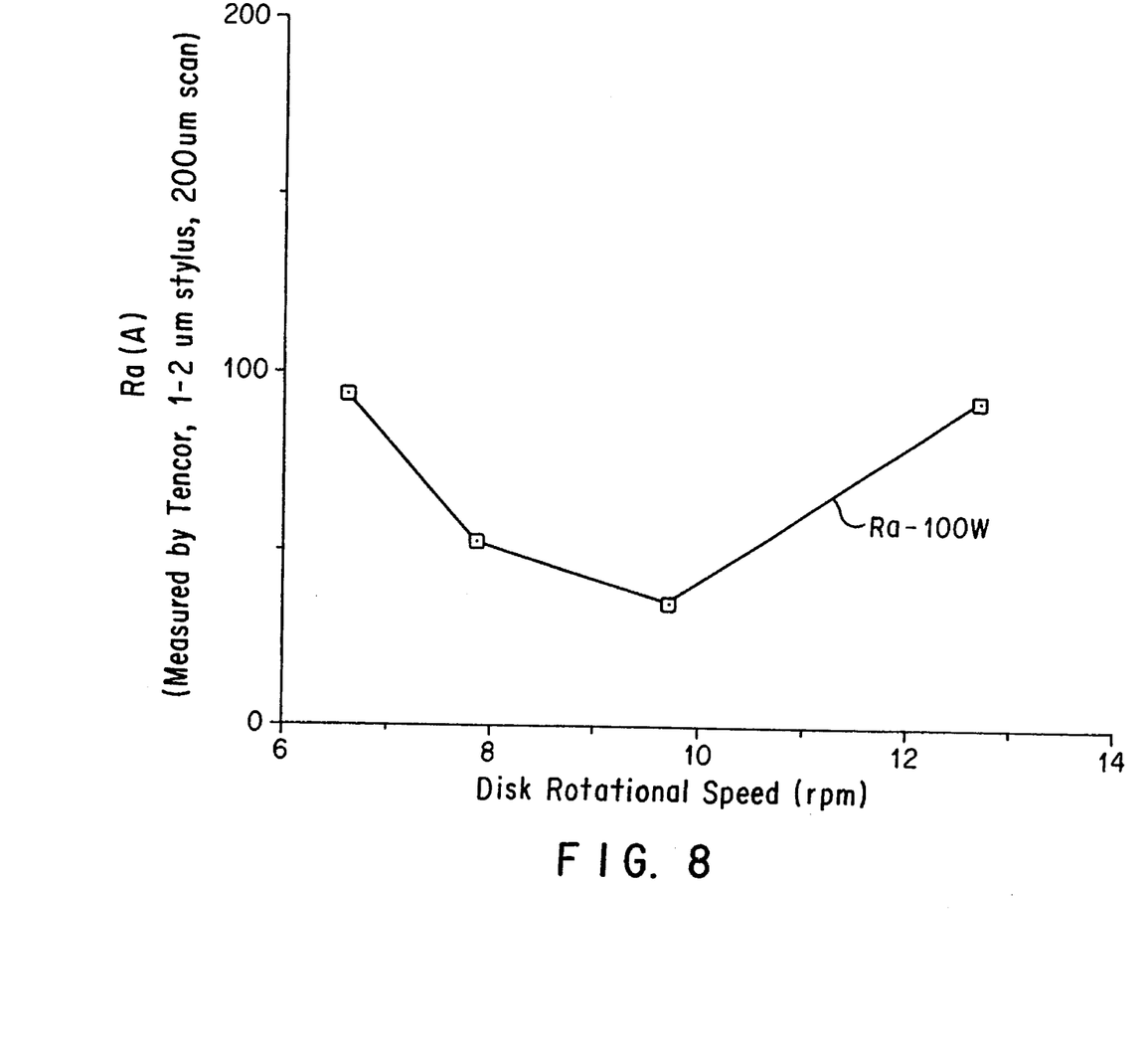
FIG. 8 is a graph showing the relative texturing of a carbon substrate with a $CO_2$ laser at 100 W using different rotational speeds.
Figure 9:
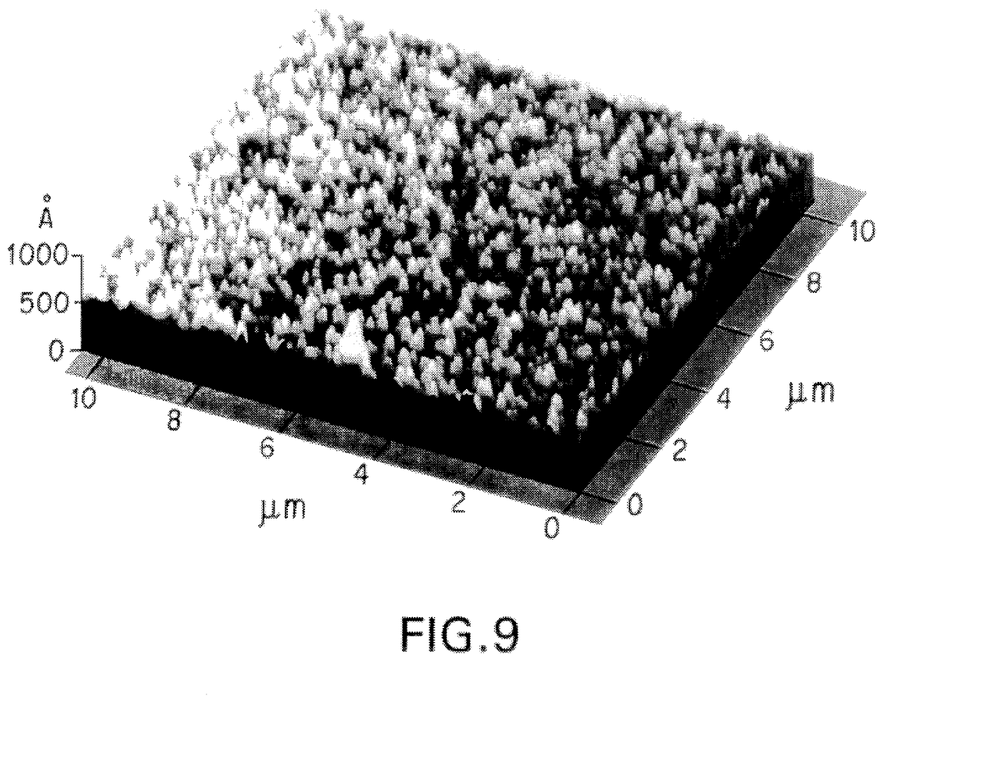
FIG. 9 is an AFM image of a catalyst deposited, laser (75 W) textured carbon surface.

A polished carbon substrate disk having sputtered thereon a 5 A layer of Cr as discrete islands was irradiated with a $CO_2$ laser light beam having a 1 mm beam size. The laser was operated at 13–100 watts for 8–180 seconds and the substrate disk was rotated using a disk rotational speed of 3–15 rpm. The degree of texturing obtained in this manner is shown in FIGS. 7, 8 and 9.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for roughening a carbon surface, comprising the steps of:
   (1) forming discrete areas of a solid non-magnetic transition metal oxidation catalyst on a carbon surface by sputtering, ion implantation, chemical vapor deposition, plasma Spraying, solution immersion or solution coprecipitation to form a catalyst-containing surface; and
   (2) heating said catalyst-containing surface in an oxidizing atmosphere to oxidize the carbon surface and to form a roughened carbon surface having a roughness greater than the roughness of said carbon surface.

2. The method of claim 1, wherein said roughened carbon surface has a texture of about 10–200 Å Ra and Rmax of less than 10×Ra.

3. The method of claim 1, wherein said discrete areas are formed by sputtering.

4. The method of claim 1, wherein said heating comprises irradiating said catalyst-containing surface with a high intensity lamp.

5. The method of claim 1, wherein said heating comprises heating in an oven or furnace.

6. The method of claim 1, wherein said oxidation catalyst is chromium, tantalum or copper.

7. The method of claim 6, wherein said oxidation catalyst is chromium.

8. The method of claim 1, wherein said carbon surface is a polished carbon substrate of a magnetic disk.

9. The method of claim 1, wherein said carbon surface is a carbon overcoat layer applied over a magnetic recording material on a magnetic disk.

10. The method of claim 1, wherein said discrete areas of said solid oxidation catalyst are formed on one or more zones of said carbon surface, the remainder of said carbon surface remaining free of said solid oxidation catalyst.

11. The method of claim 1, wherein said discrete areas of solid oxidation catalyst are uniformly formed on said carbon surface.

12. The method of claim 1, wherein said heating comprises irradiating said catalyst-containing surface with a laser.

13. The method of claim 12, wherein said laser is a Nd:YAG or a $CO_2$ laser.

14. The method of claim 12, wherein said laser is a $CO_2$ laser and said irradiating is conducted using a laser power of 10–2,000 watts.

15. The method of claim 14, wherein said irradiating is conducted for 5–180 seconds.

16. The method of claim 14, wherein said solid oxidation catalyst is Cr.

17. A method for roughening the surface of a polished carbon substrate disk for a magnetic recording media, comprising the steps of:

(1) forming discrete areas of a solid non-magnetic transition metal oxidation catalyst on a surface of said carbon substrate by sputtering, ion implantation, chemical vapor deposition, plasma spraying, solution immersion or solution coprecipitation to form a catalyst-containing surface on said carbon substrate;

(2) rotating said catalyst-containing surface of said carbon substrate at 3–15 rpm; and (3) irradiating said rotating carbon-containing surface of said carbon substrate with a $CO_2$ laser operated at a laser power of 10–2,000 watts for a time of about 5–180 seconds in the presence of oxygen to form a roughened carbon surface on said carbon substrate.

18. The method of claim 17, wherein said roughened carbon surface has a texture of about 10–100 angstroms Ra.

19. The method of claim 17, wherein said oxidation catalyst is chromium, tantalum or copper.

20. The method of claim 19, wherein said oxidation catalyst is chromium.

* * * * *